United States Patent [19]
Mikan, Jr. et al.

[11] Patent Number: 6,094,062
[45] Date of Patent: Jul. 25, 2000

[54] COUPLED NOISE REDUCTION CIRCUITRY

[75] Inventors: Donald George Mikan, Jr.; Eric Bernard Schorn, both of Austin, Tex.

[73] Assignee: International Business Machines Corporation, Armonk, N.Y.

[21] Appl. No.: 09/190,560

[22] Filed: Nov. 12, 1998

[51] Int. Cl.[7] .................................................. H03K 17/16
[52] U.S. Cl. ............................... 326/21; 326/21; 326/26; 326/27; 326/29; 326/30; 326/22; 326/23; 326/24; 326/86
[58] Field of Search .................................. 326/21, 22, 23, 326/24, 26, 27, 29, 30, 86

[56] References Cited

U.S. PATENT DOCUMENTS 4,626,889  12/1986  Yamamoto et al. ...................... 357/71
5,789,936   8/1998  Kim .......................................... 326/21

*Primary Examiner*—Michael Tokar
*Assistant Examiner*—Vibol Tan
*Attorney, Agent, or Firm*—Anthony V.S. England

[57] ABSTRACT

Switching on a first line, from a first signal level to a second level, tends to induce a change in signal level of a second line. To reduce induced noise, the second line is connected to a power rail for a predetermined time interval, responsive to the switching on the first line. The connecting for the time interval tends to counteract the change induced in the second line by the signal of the first line.

16 Claims, 3 Drawing Sheets ance appearing as 6,094,062.

COUPLED NOISE REDUCTION CIRCUITRY

TECHNICAL FIELD

This invention relates generally to electromagnetic coupling of conductors, and more specifically concerns noise induced among conductors used for transmitting information in the context of microelectronic circuitry.

BACKGROUND OF THE INVENTION

In many high performance microprocessor and ASIC designs there exist long conductive lines on which the peak noise must be controlled to ensure adequate noise margin for the receiver of the long line. This problem has traditionally been handled by improving the noise margin of the receiving circuitry at significant performance impact, inserting buffers, or altering the physical geometry of the wires to reduce line to line coupling effects. In many instances, however, there are wiring/floorplan congestions which constrain physical solutions. Therefore, a need exists to route conductive lines next to each other in microelectronic chips for long distances, while maintaining control over the maximum amount of noise coupled between them.

SUMMARY OF THE INVENTION

This invention addresses the foregoing need as follows.

In one form, a method for reducing noise induced among conductive lines in microelectronic circuitry, includes a number of steps. Switching on a first line, from a first signal level to a second level, tends to induce a change in signal level of a second line. The second line is connected to a power rail for a predetermined time interval, responsive to the switching on the first line. Moreover, the connecting for the time interval tends to counteract the change induced in the second line by the signal of the first line.

In a further aspect, the connecting of the second line to the power rail is in a single region on the second line. Alternatively, the connecting to the power rail is in a number of regions on the second line.

In a still further aspect, the first signal level is at a lower voltage level than the second signal level. The power rail to which the second line is connected for the time interval is at a voltage level at least as low as the lower voltage level.

In another aspect, the first signal level is at a higher voltage level than the second signal level. That is, the first line is switched from a high voltage to a lower voltage. In this s case, the power rail to which the second line is connected for the time interval is at a voltage level at least as high as the high voltage level.

In another form, an apparatus for reducing noise induced among conductive lines in microelectronic circuitry, includes first and second transistors connected in series. The transistors connect, through conducting electrodes of the transistors, the first line to a power rail. The first transistor has its gate connected to the second line. Third and fourth transistors are also connected in series, with the third and fourth transistors connecting, through conducting electrodes of the third and fourth transistors, the second line to the power rail. The second transistor has its gate connected to the first line. Additional logic circuitry has first and second inputs connected to the first and second lines, respectively, and an output connected to gates of the second and fourth transistors.

In one aspect the signals have a first and second voltage level, the first voltage level being a lower voltage than the second voltage level. The logic circuitry includes a NOR gate, in which case the previously mentioned power rail is at a voltage level at least as low as the low voltage. In a further aspect, the logic circuitry may alternatively include a NAND gate, in which case the power rail is at a voltage level at least as high as the high voltage.

In a further aspect, the connections of the first and second lines to the power rail are in a first region of the lines. In still further aspects, a second instance of the first through fourth transistors and logic circuitry are included, the connections of the first and second lines to the power rail for the second instance being in a second region of the lines.

In a more generally stated form, an apparatus for reducing noise induced among conductive lines in microelectronic circuitry, includes logic circuitry having first and second inputs connected to first and second lines, respectively, and an output responsive to signals on the respective lines. First control circuitry connects the first line to a power rail, responsive to the signal on the second line and the output from the logic circuitry. Second control circuitry connects the second line to the power rail, responsive to the signal on the first line and the output from the logic circuitry.

In a further aspect, the apparatus includes first control and logic circuitry and second control and logic circuitry. In the first such circuitry, logic circuitry has first and second inputs connected to first and second lines, respectively, and an output responsive to signals on signals on the respective lines. First control circuitry therein connects the first line to a power rail, responsive to the signal on the second line and the output from the logic circuitry. Second control circuitry therein connects the second line to the power rail, responsive to the signal on the first line and the output from the logic circuitry. Furthermore, in the first such control and logic circuitry, the logic circuitry includes a NOR gate, and the power rail is at a voltage at least as low as the low voltage.

The second control and logic circuitry includes second logic circuitry having first and second inputs connected to the first and second lines, respectively, and an output responsive to signals on the signals on the respective lines. Third control circuitry in the second control and logic circuitry connects the first line to a second power rail, responsive to the signal on the second line and the output from the second logic circuitry. Fourth control circuitry in the second control and logic circuitry connects the second line to the second power rail, responsive to the signal on the first line and the output from the second logic circuitry. Furthermore, the second logic circuitry includes a NAND gate and the second power rail is at a voltage level at least as high as the high voltage.

DETAILED DESCRIPTION OF THE PREFERRED EMBODIMENT

As generally stated above, in microelectronic circuitry, switching a conductive line from a first voltage level to a second voltage level may momentarily induce a substantial voltage in a nearby line if the nearby line is substantially parallel to the first line for a substantial length, and the voltage level change is large enough and at a large enough lime rate of change. For example, switching a line from 0 volts to 1.35 volts at a time rate of change of 10 volts per nanosecond can induce a substantial voltage in a second line which is spaced 0.35 micron from the first line and is substantially parallel for a distance of 300 microns.

Circuitry is shown in both FIG's 1 and 2 which reduces coupled noise between a pair of proximate lines while requiring neither receiver modification, nor wiring changes. Instead, either or both of these small circuits are placed somewhere on the path of the line pair and will thereby reduce the noise induced in one of the lines by a voltage on the other line with very little performance impact.

Figure 1:
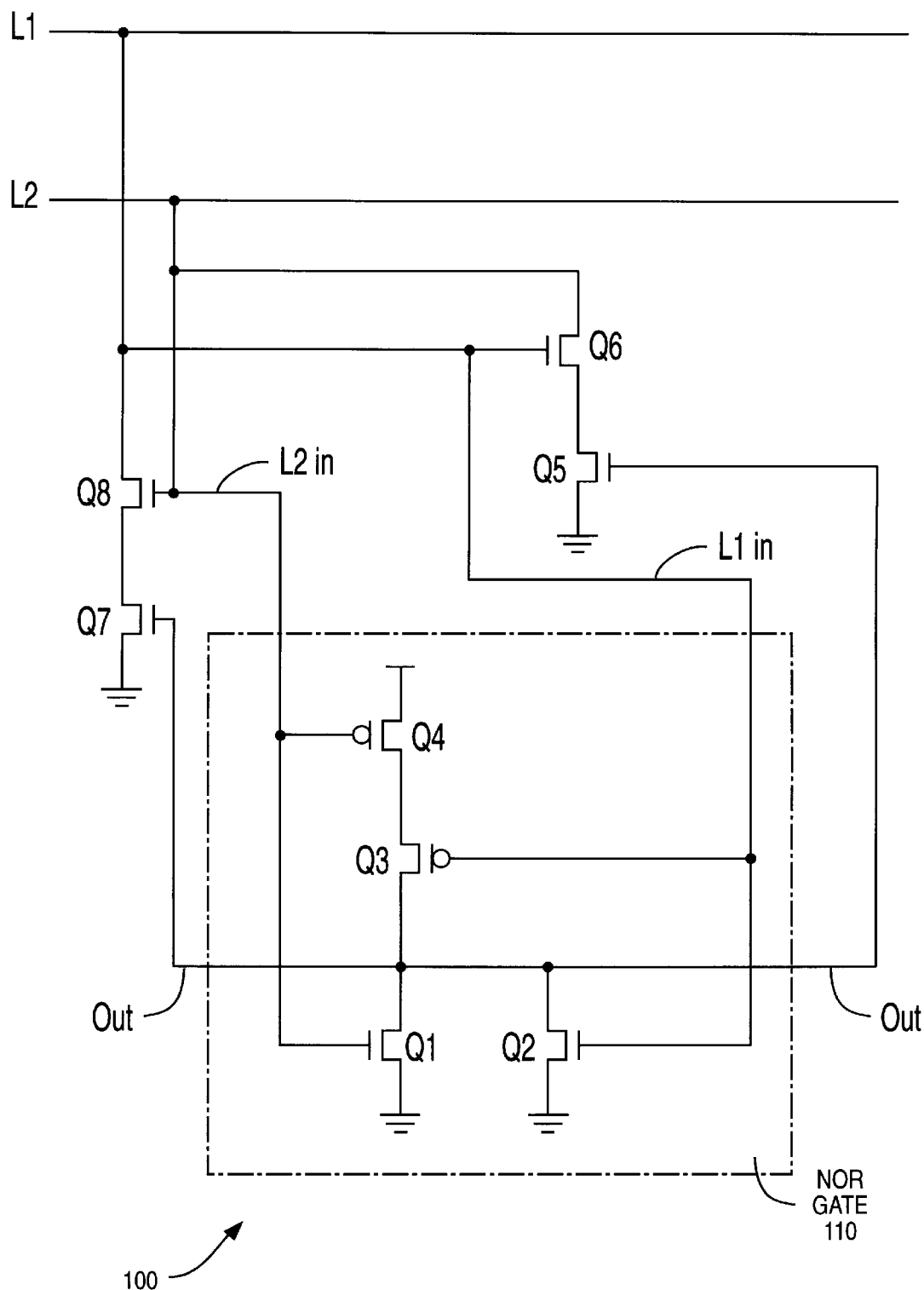
FIG. 1 is a schematic of a first embodiment of the invention.

Referring to FIG. 1, CMOS NFET's Q7 and Q8 are coupled in series, with the drain of Q8 connected to line 1, and the source of Q7 connected to ground. Similarly, NFET's Q5 and Q6 are coupled in series, with the drain of Q6 connected to line 2, and the source of Q5 connected to ground.

FET's Q1 through 4 form a two input NOR gate, with each respective NFET-PFET Pair of gates receiving an input. That is, the Q1 NFET is paired with the Q4 PFET, both gates of which are connected to line 2, and also to the gate of NFET Q8. Similarly, the Q2 NFET is paired with the Q3 PFET, both gates of which are connected to line 1, and also to the gate of NFET Q6. The common node at the Q1 through Q3 drains, provide the NOR output, which is also connected to the gates of NFET's Q5 and Q7.

Operation of the circuit of FIG. 1 is as follows. According to one embodiment, signals on lines 1 and 2 are voltages wherein a voltage level of 0.135 volts or less represents one logic state, and a voltage of 1.215 or more represents another logic state. Beginning with both lines at the lower voltage level, when either one of the lines switches high, then the circuitry shown will drive the opposite line low for a shot interval of time, which will reduce the impact of coupling between the switching net and the non-switching net. For example, when line 1 goes high, this changing voltage change in line 1 tends to induce a voltage in line 2 through an unavoidable capacitance between the long parallel lines. The circuitry of FIG. 1 tends to counteract this induced voltage in line 2, as follows. The output of the NOR circuit formed by Q1 through Q4 begins high with both line 1 and line 2 low, which turns on the NOR output, turning on Q5 and Q7. Line 1 going high tends to turn on QN6. With both Q5 and Q6 tending to be on, this tends to ground line 2, through Q5 and Q6, counteracting the tendency for the voltage in line 1 to induce a voltage in line 2. The grounding of line 2 through Q5 and Q6, is controlled by the circuitry of FIG. 1 to be only momentary. That is, the NOR output tends to be pulled down by line 1 going high, and the NOR output being pulled down tends to turn off Q5, interrupting the circuit to pate from line 2 to ground through Q5 and Q6. The momentary interval of time where the quiet net, i.e., line 2 in this example, is driven low is controlled by tuning the delay through the NOR gate. Notice that if both lines are switching high at identical times it appears superficially that performance might be impacted detrimentally. However, on more careful analysis it can be seen that there are two effects which limit any performance impact of the low-driving circuitry. First, if both lines are being driven high, the delay through the NOR gate becomes much less, so the amount of time the NOR tends to drive low is reduced. Second, coupling between two lines that are both being driven high tends to help drive the lines high, so the coupling between lines 1 and 2, in this instance tends to offset the small delay penalty otherwise imposed by the circuitry.

Figure 2:
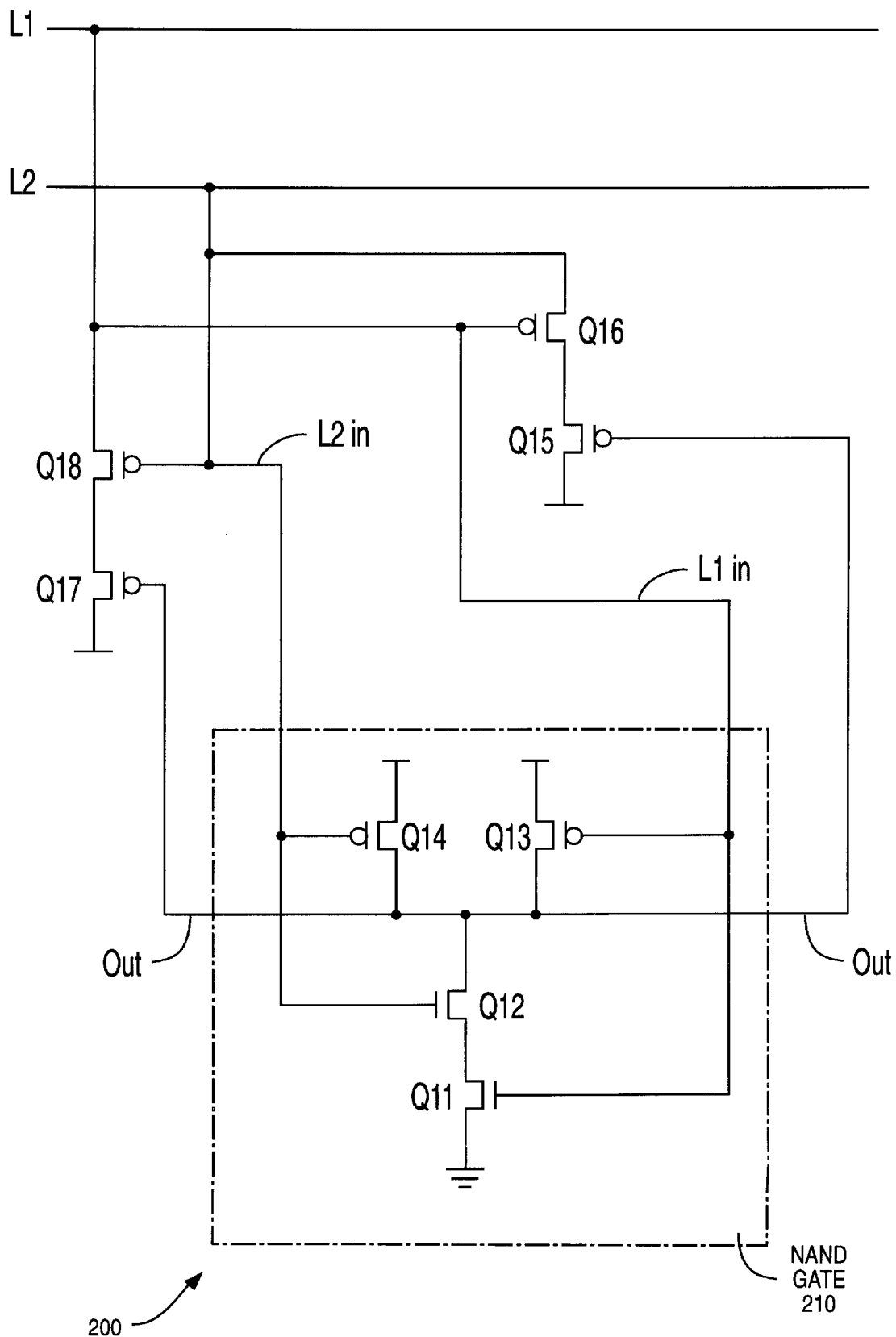
FIG. 2 is a schematic of a second embodiment of the invention.

Referring now to FIG. 2, additional circuitry is shown which is useful for the case where both lines are high and one of them switches low. CMOS NFET's Q17 and Q18 are coupled in series, with the drain of Q18 connected to line 1, and the source of Q17 connected to Vdd. Similarly, NFET's Q15 and Q16 are coupled in series, with the drain of Q16 connected to line 2, and the source of Q15 connected to Vdd. FET's Q11 through 14 form a two input NAND gate, with each respective NFET-PFET pair of gates receiving an input. That is, the Q11 NFET is paired with the Q14 PFEF, both gates of which are connected to line 2, and also to the gate of NFET Q18. Similarly, the Q12 NFET is paired with the Q13 PFET, both gates of which are connected to line 1, and also to the gate of NFET Q16. The common node at the Q12 through Q14 drains, provide the NAND output, which is also connected to the gates of NFET's Q15 and Q17.

The operation of the circuitry of FIG. 2 is as follows. Beginning with both lines high, the voltage from the lines coupled to the gates of Q16 and Q18 respectively tends to turn the PFET's off. The voltage from the lines coupled to the input of the NAND pulls the NAND output low, tending to turn on Q15 and Q17. Then, when line 1, for example, goes low this tends to turn on Q16. With Q16 and Q15 both on this couples Vdd through Q15 and Q16 to line 2 momentarily, tending to counteract the low voltage induced into line 2 by line 1 going low. Line 1 going low also, however, tends to turn on the NAND output, which tends to turn off Q15 and Q17. Q15 turning off disconnects the path from line 2 to Vdd, so that line 2 is only connected to Vdd by the circuitry of FIG. 2 for the momentary interval when line 1 going low turns on Q16, before the NAND gate turns off Q15.

Notice that if both lines are switching low at identical times it appears superficially that performance might be impacted detrimentally. However, on more careful analysis it can be seen that there are two effects which limit any performance impact of the high-driving circuitry. First, if both lines are being driven low, the delay through the NAND gate becomes much less, so the amount of time the NAND tends to drive high is reduced. Second, coupling between two lines that are both being driven low tends to help drive the lines low, so the coupling between lines 1 and 2, in this instance tends to offset the small delay penalty otherwise imposed by the circuitry.

Figure 3:
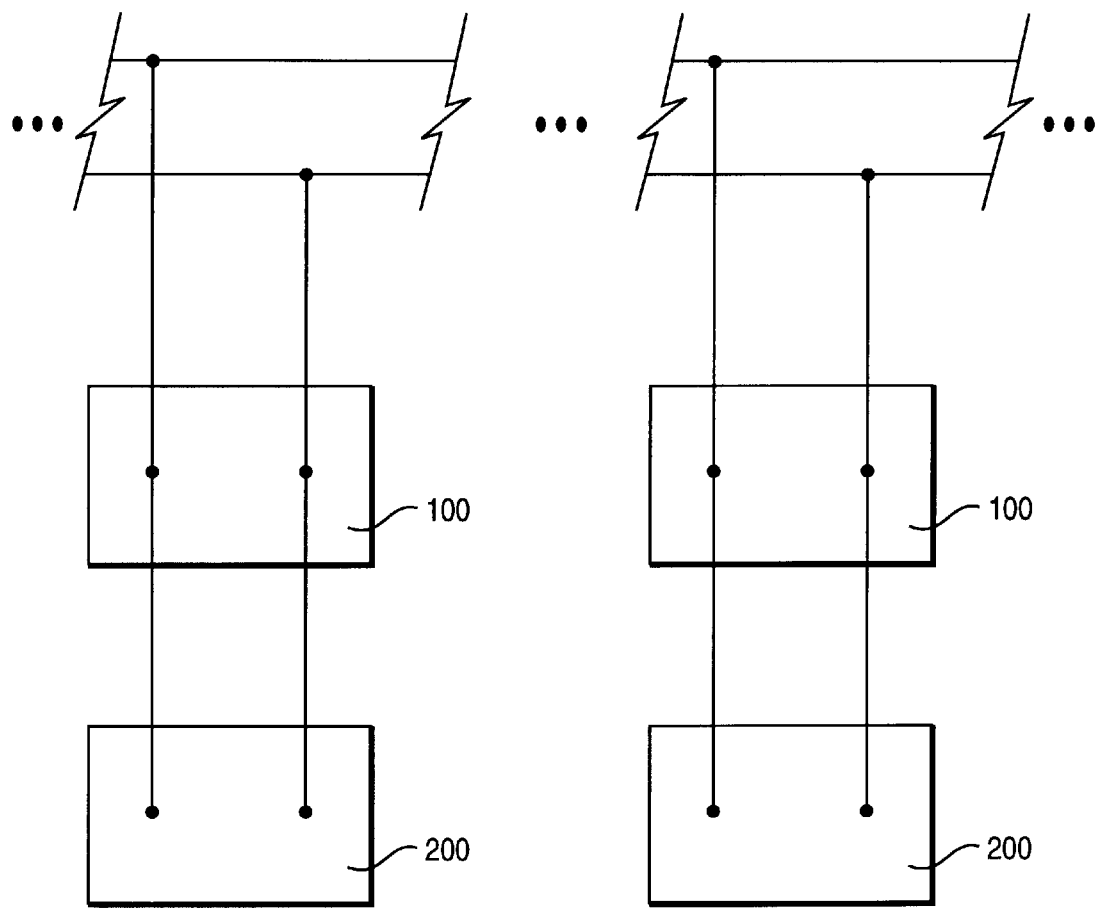
FIG. 3 is a schematic of a distributed embodiment.

Referring now to FIG. 3, an embodiment is shown wherein in a first region of the lines 1 and 2, circuitry 100 and 200 are connected to the lines, and in a second region of the lines second instances of circuitry 100 and 200 are connected.

While the invention has been shown and described with reference to particular embodiments; thereof, it will be understood by those skilled in the art that the foregoing and other changes in form and detail may be made therein without departing from the spirit and scope of the invention. For example, FIG's 1 and 2 show only two lines. There may be numerous parallel lines, which could be considered as numerous pairs of adjacent lines to which instances of the circuitry 100 and/or 200 could be connected. Also, the circuitry shown in FIG's 1 and 2 has been described in terms of being responsive to voltages. It should be understood that embodiments wherein lines are switched between predetermined voltage levels, current levels, and/or high impedance states, and/or the circuitry is responsive to voltage, current or impedance is encompassed within the spirit of the invention. Consequently the term "signal" is used in the claims to encompass all such alternatives.

What is claimed is:

1. An apparatus for reducing noise induced among conductive lines in microelectronic circuitry, comprising:

first and second transistors connected in series, wherein the transistors connect, through conducting electrodes of the transistors, the first line to a power rail, and wherein the first transistor has a gate connected to the second line;

third and fourth transistors connected in series, wherein the third and fourth transistors connect, through conducting electrodes of the third and fourth transistors, the second line to the power rail, and wherein the second transistor has a gate connected to the first line; and logic circuitry having first and second inputs connected to the first and second lines, respectively, and an output connected to gates of the second and fourth transistors.

2. The apparatus of claim 1, wherein the logic circuitry includes a NOR gate, the signals having a higher voltage level and a lower voltage level, and wherein the power rail is at a voltage level at least as low as the low voltage.

3. The apparatus of claim 1, wherein the logic circuitry includes a NAND gate and the power rail is at a voltage level at least as high as the high voltage.

4. The apparatus of claim 1, wherein the connections of the first and second lines to the power rail are in a first region of the lines.

5. The apparatus of claim 1, comprising a second instance of the first through fourth transistors and logic circuitry, and the connections of the first and second lines to the power rail for the second instance are in a second region of the lines.

6. An apparatus for reducing noise induced among conductive lines in microelectronic circuitry, comprising:

logic circuitry having first and second inputs connected to first and second lines, respectively, and an output responsive to signals on the respective lines;

first control circuitry for connecting the first line to a power rail, responsive to the signal on the second line and the output from the logic circuitry; and second control circuitry for connecting the second line to the power rail, responsive to the signal on the first line and the output from the logic circuitry.

7. The apparatus of claim 6, wherein the logic circuitry includes a NOR gate, the signals have a higher voltage and a lower voltage level, and wherein the power rail is at a voltage at least as low as the lower voltage.

8. The apparatus of claim 6, wherein the logic circuitry includes a NAND gate and the power rail is at a voltage level at least as high as the higher voltage.

9. The apparatus of claim 6, wherein the connections of the first and second lines to the power rail are in a first region of the lines.

10. The apparatus of claim 6, comprising a second instance of the first through fourth transistors and logic circuitry, and the connections of the first and second lines to the power rail for the second instance are in a second region of the lines.

11. An apparatus for reducing noise induced among conductive lines in microelectronic circuitry, comprising:

first logic circuitry having first and second inputs connected to first and second lines, respectively, and an output responsive to signals on signals on the respective lines, the signals having two voltage levels, one level being relatively higher than the other level;

first control circuitry for connecting the first line to a power rail, responsive to the signal on the second line and the output from the logic circuitry;

second control circuitry for connecting the second line to the power rail, responsive to the signal on the first line and the output from the logic circuitry, wherein the logic circuitry includes a NOR gate, and the power rail is at a voltage at least as low as the lower voltage;

second logic circuitry having first and second inputs connected to the first and second lines, respectively, and an output responsive to signals on the signals on the respective lines;

third control circuitry for connecting the first line to a second power rail, responsive to the signal on the second line and the output from the second logic circuitry;

fourth control circuitry for connecting the second line to the second power rail, responsive to the signal on the first line and the output from the second logic circuitry, wherein the second logic circuitry includes a NAND gate and the second power rail is at a voltage level at least as high as the higher voltage.

12. A method for reducing noise induced among conductive lines in microelectronic circuitry, comprising the steps of:

switching, on a first line, from a first signal level to a second level, wherein the switching tends to induce a change in signal level of a second line;

connecting the second line to a power rail for a predetermined time interval responsive to the switching on the first line, wherein the connecting for the time interval tends to counteract the change induced in the second line by the signal of the first line.

13. The method of claim 12, wherein the connecting of the second line to the power rail is at a single location on the second line.

14. The method of claim 12, wherein the connecting of the second line to the power rail is at a number of locations on the second line.

15. The method of claim 12, wherein the first signal level is at lower voltage level than the second signal level, and the power rail to which the second line is connected for the time interval is at a voltage level at least as low as the lower voltage level.

16. The method of claim 12, wherein the first signal level is a higher voltage level than the second signal level, and the power rail to which the second line is connected for the time interval is at a voltage level at least as high as the high voltage level.

* * * * *